(12) United States Patent
Jin et al.

(10) Patent No.: US 11,969,964 B2
(45) Date of Patent: Apr. 30, 2024

(54) METHOD FOR MANUFACTURING SILVER-PLATED REFLECTING FILM

(71) Applicant: NINGBO SOLARTRON TECHNOLOGY CO., LTD., Ningbo (CN)

(72) Inventors: Yadong Jin, Ningbo (CN); Yubo Zhou, Ningbo (CN)

(73) Assignee: NINGBO SOLARTRON TECHNOLOGY CO., LTD., Ningbo (CN)

(*) Notice: Subject to any disclaimer, the term of this patent is extended or adjusted under 35 U.S.C. 154(b) by 921 days.

(21) Appl. No.: 16/551,748

(22) Filed: Aug. 27, 2019

(65) Prior Publication Data

US 2019/0389161 A1 Dec. 26, 2019

Related U.S. Application Data

(63) Continuation-in-part of application No. 14/779,861, filed as application No. PCT/CN2013/085874 on Oct. 24, 2013, now abandoned.

(30) Foreign Application Priority Data

May 22, 2013 (CN) .......................... 201310195392.7

(51) Int. Cl.
*B29D 11/00* (2006.01)
*B32B 27/08* (2006.01)
(Continued)

(52) U.S. Cl.
CPC .......... *B29D 11/0073* (2013.01); *B32B 27/08* (2013.01); *B32B 27/20* (2013.01);
(Continued)

(58) Field of Classification Search
CPC ....... C23C 14/20; C23C 14/205; C23C 14/24; C23C 14/34; C23C 14/58; B29D 11/0073;
(Continued)

(56) References Cited

U.S. PATENT DOCUMENTS 5,095,186 A * 3/1992 Scott Russell ..... B65D 81/3453
426/243
5,589,280 A * 12/1996 Gibbons ................ C23C 14/024
204/192.15
(Continued)

FOREIGN PATENT DOCUMENTS

CN 101278213 A * 10/2008 ............. H01L 33/60
EP 0 151 850 A2 * 8/1985
(Continued)

OTHER PUBLICATIONS

Translation to CN 101278213 published Oct. 2008.*

*Primary Examiner* — John J Brayton

(57) ABSTRACT

This disclosure provides a method for manufacturing a silver-plated reflecting film. The method includes following steps: (1) manufacturing a reflecting polyester film layer; (2) coating a silver-plated layer on one surface of the reflecting polyester film layer by a vacuum sliver plating method, wherein the vacuum silver plating methods comprises a vacuum evaporation plating method or a vacuum sputtering silver plating method; and (3) applying a protection layer film on the silver-plated layer and obtaining the silver-plated reflecting film.

11 Claims, 1 Drawing Sheet

(51) Int. Cl.

| | |
|---|---|
| *B32B 27/20* | (2006.01) |
| *B32B 27/32* | (2006.01) |
| *B32B 27/36* | (2006.01) |
| *C23C 14/20* | (2006.01) |
| *C23C 14/24* | (2006.01) |
| *C23C 14/34* | (2006.01) |
| *C23C 14/58* | (2006.01) |
| *G02B 1/14* | (2015.01) |
| *G02B 5/08* | (2006.01) |
| *B29K 67/00* | (2006.01) |
| *B29K 105/04* | (2006.01) |
| *B29K 105/16* | (2006.01) |
| *B29K 509/00* | (2006.01) |

(52) U.S. Cl.
CPC .............. *B32B 27/32* (2013.01); *B32B 27/36* (2013.01); *C23C 14/20* (2013.01); *C23C 14/205* (2013.01); *C23C 14/24* (2013.01); *C23C 14/34* (2013.01); *C23C 14/58* (2013.01); *G02B 1/14* (2015.01); *G02B 5/0808* (2013.01); *B29K 2067/00* (2013.01); *B29K 2105/04* (2013.01); *B29K 2105/162* (2013.01); *B29K 2509/00* (2013.01); *B32B 2255/10* (2013.01); *B32B 2255/205* (2013.01); *B32B 2264/102* (2013.01); *B32B 2264/104* (2013.01)

(58) Field of Classification Search
CPC ........... G02B 1/14; B32B 27/08; B32B 27/20; B32B 27/32; B32B 27/36
See application file for complete search history.

(56) References Cited

U.S. PATENT DOCUMENTS

| | | | |
|---|---|---|---|
| 6,255,003 B1 * | 7/2001 | Woodard | ............ C03C 17/3639 |
| | | | 428/458 |
| 2008/0070998 A1 * | 3/2008 | Takada | ........................ C08J 9/04 |
| | | | 521/50.5 |
| 2012/0098014 A1 * | 4/2012 | Muramoto | .............. H01L 33/22 |
| | | | 257/E33.064 |

FOREIGN PATENT DOCUMENTS

| | | | |
|---|---|---|---|
| JP | 09314736 A | * 12/1997 | ............. B32B 15/04 |
| JP | 2003266522 A | * 9/2003 | |

* cited by examiner

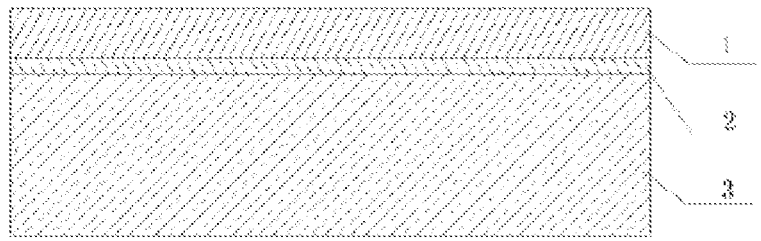

METHOD FOR MANUFACTURING SILVER-PLATED REFLECTING FILM

CROSS-REFERENCE TO RELATED APPLICATIONS

This application is a continuation-in-part of U.S. patent application Ser. No. 14/779,861 filed on Sep. 24, 2015, which is a 371 of international of PCT patent application PCT/CN2013/085874 filed on Oct. 24, 2013, which claims all benefits accruing under 35 U.S.C. § 119 from China Patent Application No. 201310195392.7, filed on May 22, 2013, in the China National Intellectual Property Administration, the content of which is hereby incorporated by reference.

TECHNICAL FIELD

The described embodiments relate to the technical field of reflecting films, and in particular, to a method for manufacturing a silver-plated reflecting film.

BACKGROUND

A liquid crystal backlight system is primarily comprised of a light source, a light guide plate, different kinds of optical films and structural members, s to provide a diversified, light and portable size, while meeting the requirement of high luminance. Current types of backlight sources mainly contain electro luminescence (EL), cold cathode fluorescent tube (CCFL), light emitting diode (LED) etc., which are divided into a side-light type and an end backlight type according to different positions thereof. Along with the development of the LCD module, the side-light type CCFL backlight source of high brightness and thin profile have become mainstream, but due to large power consumption, the power conservation requirement of a portable information product cannot be met. Therefore, improving the backlight source brightness to further increase the LCD brightness without increasing the power consumption is also one of the main trends in development. How to improve the optical property of the reflecting film, improve the reflectivity thereof, and fully utilize the light emitted by the light source to reduce loss, is an important subject in this field.

Presently, the reflecting film structure usually forms the white polyester film of porous structure via bubbles. Products such as Toray and SKC all intensively rely on the difference between the refractive indexes of the matrix resin and micropores or bubbles to improve reflectivity, namely controlling the center cell and the bubble density to improve reflectivity. However, the reflectivity of the foaming type white reflecting film can only reach 96-97%, and is difficult to improve.

SUMMARY

In order to overcome the deficiencies of the existing optical reflecting films, the present disclosure provides a method for manufacturing a silver-plated reflecting film with a high reflectivity, which can reach 99% or more.

In order to solve the above-mentioned technical problems, the present disclosure provides the following technical solutions:

A silver-plated reflecting film, wherein the reflecting film comprises a reflecting polyester film layer, a silver-plated layer and a protection layer; wherein the silver-plated layer is placed between the reflecting polyester film layer and the protection layer; and the reflecting polyester film layer contains 5-25% nanometer modified inorganic filler comprising filler particles, and the percentage is percentage by weight. Reflectivity of the reflecting polyester film layer is ≥94%.

The reflecting film can include the reflecting polyester film layer, the silver-plated layer and the protection layer.

The reflecting polyester film layer can have a micro-bubble structure, and the micro-bubble has a cell size of 1-10 microns, with a density of $10^8$-$10^{10}$/cm$^3$.

The filling particles of the nanometer modified inorganic filler can be selected from one of, or a combination of at least two of, titanium dioxide, barium sulfate, calcium carbonate and zinc oxide; and the modification coating material for the inorganic filler is silica and/or alumina. The nanometer modified inorganic filler can be manufactured into masterbatch for use, and the masterbatch is added with a certain amount of additives commonly used in the field.

The reflecting polyester film layer can be manufactured to obtain a micro-bubble structure by physical foaming with supercritical carbon dioxide, and the micro bubbles have a cell size of 1-10 micron and a density of $10^8$-$10^{10}$/cm$^3$.

The cell size and density can be adjusted by controlling the proportion of the masterbatch and supercritical carbon dioxide, and 0.02-0.1 cubic meter of liquid carbon dioxide is added to every kilogram of masterbatch. Preferably, 0.05 cubic meters of liquid carbon dioxide is added to every kilogram of masterbatch, or 0.08 cubic meters of liquid carbon dioxide is added to every kilogram of masterbatch.

The thickness of the reflecting polyester film layer can be 50-150 µm, the thickness of the silver-plated layer is 0.5-1.5 µm, and the thickness of the protection layer is 2-30 µm.

The protection layer can be selected from one of a polyester film, a polycarbonate film, a polyethylene film or a polypropylene film. The protection layer may also be called an anti-oxidation film, and has good antioxygenic property to prevent the silver-plated layer from being oxidized.

Further, the silver-plated layer can be produced by a vacuum sliver silver plating method, in which silver is coated on one surface of the reflecting polyester film layer, and the vacuum sliver silver plating comprises vacuum evaporation plating and vacuum sputtering silver plating. The working vacuum degree of the vacuum silver plating is 10-1.0×$10^{-1}$ Pa, the operating temperature is 850-1000° C., and the film forming speed is 0.01-5 mm/min. After silver-plating, the annealing treatment is performed on the reflecting polyester film layer in the nitrogen or inert gas.

Further, the particle size of the nanometer modified inorganic filler particles is 200-400 nm.

The present disclosure further provides a method for manufacturing the above-descried silver-plated reflecting film, wherein the manufacturing method can comprise the following steps:

(1) manufacturing a reflecting polyester film layer;

(2) coating a silver-plated layer on one surface of the reflecting polyester film layer by a vacuum silver plating method, wherein the vacuum silver plating methods comprises a vacuum evaporation plating method or a vacuum sputtering silver plating method; and (3) applying a protection layer film on the silver-plated layer and obtaining the silver-plated reflecting film.

The silver-plated layer can be prepared by the vacuum sputtering silver plating method, which comprises the following steps:

putting 99.99% silver in a target of a sputtering chamber, with Ar as a sputtering gas, a vacuum level of 10-1.0×

$10^{-1}$ Pa, a working temperature of 850° C. to 1000° C., and a film forming speed of 0.01 mm/min to 5 mm/min; and forming a silver-plated layer on the reflecting polyester film layer.

After the step of forming the silver-plated layer on the reflecting polyester film layer, performing an annealing treatment under nitrogen at the room temperature.

The silver-plated layer can be prepared by the vacuum evaporation plating method, which comprises the following steps:

putting 99.99% silver in a crucible of a evaporation chamber, with a vacuum level of $10-1.0\times10^{-1}$ Pa, a working temperature of 2000° C. to 2500° C., and a film forming speed of 0.01 mm/min to 5 mm/min; and forming a silver-plated layer on the reflecting polyester film layer.

The protection layer film can be applied on the silver-plated layer by a dry-type film covering method.

The dry-type film covering method comprises the following steps:

the protection layer film passing through a heated channel of 90° C.; and pressing the protection layer film onto the silver-plated layer.

The method comprises a step of rolling the silver-plated reflecting film up after the step of applying the protection layer film on the silver-plated layer.

The method comprises a step of rolling the silver-plated reflecting film up after the step of applying the protection layer film on the silver-plated layer.

The protection layer film can be manufactured by a tape casting method, in which a polymer is melt-extruded by a single-screw extruder to form a film on a cold roller, thereby obtaining the protection layer film by drawing and rolling up.

The reflecting polyester film layer in step (1) can be prepared by a physical foaming process that comprises:

melting and plastifying a master batch containing additives and supercritical carbon dioxide;

shearing and mixing the same into a uniform solution in the single-screw extruder; and extruding the solution out of a calendaring machine through a die head to cool, take a shape, and be stretched bi-directionally to obtain the reflecting polyester film layer.

Further, the reflecting polyester film layer comprises 5%-25% nanometer modified inorganic filler, and the percentage is a percentage by weight.

Further, the physical foaming process for manufacturing the reflecting polyester film layer in step (1) is as follows: melting and plasticating a masterbatch that contains additives and the supercritical carbon dioxide, shearing and mixing the masterbach into a uniform solution in the single-screw extruder, making the solution flow out of a calender through a die head to be cooled and molded, and further bi-directionally stretching the same to obtain the reflecting polyester film layer.

Further, the reflecting polyester film layer is foamed during a stretching process after extrusion. The temperature of processing regions of the single-screw extruder is within the range of 250–300° C.

Compared with the prior art, the silver-plated reflecting film provided by the present disclosure has an excellent reflectivity, and the manufacturing method is simple and easy to operate.

BRIEF DESCRIPTION OF THE DRAWINGS

FIG. 1 is a structural schematic diagram of a silver-plated reflecting film provided by the present disclosure, wherein 1 represents a protection layer, 2 represents a silver-plated layer, and 3 represents a reflecting polyester film layer.

DETAILED DESCRIPTION

As shown in FIG. 1, a silver-plated reflecting film (or called silver-plated composite reflecting film, or composite reflecting film) provided by the present disclosure comprises a reflecting polyester film layer 3, a silver-plated layer 2, and a protection layer 1.

The raw materials used in the present disclosure are common products commercially available in the market, and the nanometer modified inorganic filler that the present disclosure uses is the material commonly used in the field and has common parameter ranges. They can be manufactured by the users themselves or be bought on the market.

The manufacturing method for the silver-plated composite reflecting film provided by the present disclosure includes the following steps:

(1) manufacturing a reflecting polyester film layer;

(2) coating a silver-plated layer on one surface of the reflecting polyester film layer by a vacuum silver plating method, wherein the vacuum silver plating methods comprises a vacuum evaporation plating method or a vacuum sputtering silver plating method; and (3) applying a protection layer film on the silver-plated layer and obtaining the silver-plated reflecting film.

In step (2), the silver-plated layer is prepared by the vacuum sputtering silver plating method, which comprises the following steps:

putting 99.99% silver in a target of a sputtering chamber, with Ar as a sputtering gas, a vacuum level of $10-1.0\times10^{-1}$ Pa, a working temperature of 850° C. to 1000° C., and a film forming speed of 0.01 mm/min to 5 mm/min; and forming a silver-plated layer on the reflecting polyester film layer.

In an embodiment, about vacuum sputtering silver plating method, the working temperature is preferably in a range of 910° C. to 940° C., and the film forming speed is preferably in a range of 0.5 mm/min to 2 mm/min.

After the step of forming the silver-plated layer on the reflecting polyester film layer, further comprising a step of performing an annealing treatment under nitrogen at the room temperature.

The silver-plated layer is prepared by the vacuum evaporation plating method, which comprises following steps:

putting 99.99% silver in a crucible of a evaporation chamber, with a vacuum level of $10-1.0\times10^{-1}$ Pa, a working temperature of 2000° C. to 2500° C., and a film forming speed of 0.01 mm/min to 5 mm/min; and forming a silver-plated layer on the reflecting polyester film layer.

In an embodiment, about the vacuum evaporation plating method, the working temperature is preferably in a range of 2100° C. to 2300° C., and the film forming speed is preferably in a range of 0.5 mm/min to 1 mm/min.

In step (3), the protection layer film is applied on the silver-plated layer by a dry-type film covering method. The dry-type film covering method comprises the following steps: the protection layer film passing through a heated channel of 90° C.; and pressing the protection layer film onto the silver-plated layer.

After the step of applying the protection layer film on the silver-plated layer, the method further comprises a step of rolling the silver-plated reflecting film up.

Various properties of the silver-plated composite reflecting film manufactured according to the abovementioned method were tested using the following method:

Reflectivity: the ColorQuest XE spectrocolorimeter manufactured by Hunterlab Company was used to test the reflectivity of a silver-plated composite reflecting film of this disclosure by an integrating sphere d/8° structure under the D65 light condition in accordance with Standard GB/T3979-2008. The reflectivity data was the weighted average value of the reflectivity of every wavelength with 10 nm interval between 400-700 nm, and the value corresponded to the energy distribution curve of the D65 light source.

Embodiment 1

A silver-plated composite reflecting film of this disclosure was manufactured according to the above-descried method. The thickness of the reflecting polyester film layer was 50 μm, the thickness of the silver-plated layer was 1.5 μm, and the protection layer was polyethylene film with a thickness of 20 μm. The related properties of the obtained composite reflecting film are listed in Table 1.

Embodiment 2

Another silver-plated composite reflecting film of this disclosure was manufactured according to the above-described method. The thickness of the reflecting polyester film layer was 75 μm, the thickness of the silver-plated layer was 1.2 μm, and the protection layer was polypropylene film with a thickness of 15 μm. The related properties of the obtained composite reflecting film are listed in Table 1.

Embodiment 3

A silver-plated composite reflecting film of this disclosure was manufactured according to the above-described method. The thickness of the reflecting polyester film layer was 100 μm, the thickness of the silver-plated layer was 1.0 μm, and the protection layer was polyester film with a thickness of 10 μm. The related properties of the obtained composite reflecting film are listed in Table 1.

Embodiment 4

A silver-plated composite reflecting film of this disclosure was manufactured according to the above-described method. The thickness of the reflecting polyester film layer was 150 μm, the thickness of the silver-plated layer was 0.5 μm, and the protection layer was polycarbonate film with a thickness of 5 μm. The related properties of the obtained composite reflecting film are listed in Table 1.

TABLE 1

Reflectivity of the composite reflecting films of Embodiments 1-4

| Item | | Embodiments | | | |
|---|---|---|---|---|---|
| | | Embodiment 1 | Embodiment 2 | Embodiment 3 | Embodiment 4 |
| Reflectivity (%) | 550 nm | 99.4 | 99.2 | 99.1 | 99.2 |

Embodiment 5

A silver-plated composite reflecting film of this disclosure was manufactured according to the above-mentioned method. The thickness of the reflecting polyester film layer was 80 μm, the thickness of the silver-plated layer was 1.0 μm, and the protection layer was polyethylene film with a thickness of 25 μm.

The reflecting polyester film layer contained 5% nanometer modified inorganic filler, the filling particles were selected from titanium dioxide and barium sulfate (with a weight ratio of 1:1), and the modified coating material thereof was silica. The obtained composite reflecting film had a cell size of 1-10 microns, with the density of $10^8$-$10^9$/$cm^3$, and the related properties are listed in Table 2.

Embodiment 6

A silver-plated composite reflecting film of the present disclosure was manufactured according to the above-mentioned method. The thickness of the reflecting polyester film layer was 120 μm, the thickness of the silver-plated layer was 0.8 μm, and the protection layer was polypropylene film with a thickness of 2 μm.

The reflecting polyester film layer contained 25% nanometer modified inorganic filler, the filling particle was selected from titanium dioxide and calcium carbonate (with a weight ratio of 2:1), and the modified coating material thereof was silica and aluminium oxide. The obtained composite reflecting film had a cell size of 1-5 microns, with the density of $10^8$-$10^9$/$cm^3$, and the related properties are listed in Table 2.

Embodiment 7

A silver-plated composite reflecting film of the present disclosure was manufactured according to the above-described method. The thickness of the reflecting polyester film layer was 100 μm, the thickness of the silver-plated layer was 1.5 μm, and the protection layer was polyester film with the thickness of 30 μm.

The reflecting polyester film layer contained 10% nanometer modified inorganic filler, the filling particle was calcium carbonate and the modified coating material thereof wa aluminium oxide. The obtained composite reflecting film had a cell size of 3-10 microns, with the density of $10^9$-$10^{10}$/$cm^3$, and the related properties are listed in Table 2.

Embodiment 8

A silver-plated composite reflecting film of the present disclosure was manufactured according to the above-described method. The thickness of the reflecting polyester film layer was 120 μm, the thickness of the silver-plated layer was 0.6 μm, and the protection layer was polycarbonate film with the thickness of 15 μm.

The reflecting polyester film layer contained 20% nanometer modified inorganic filler, and the filling particle was zinc oxide, and the modified coating material thereof was silica. The obtained composite reflecting film had a cell size of 1-10 microns, with the density of $10^8$-$10^{10}$/$cm^3$, and the related properties are listed in Table 2.

TABLE 2

Reflectivity of the composite reflecting films of Embodiment 5-8 Embodiment

| Item | | Embodiment 5 | Embodiment 6 | Embodiment 7 | Embodiment 8 |
|---|---|---|---|---|---|
| Reflectivity (%) | 550 nm | 99.3 | 99.5 | 98.9 | 99.4 |

Embodiment 9

A silver-plated composite reflecting film of the present disclosure was manufactured according to the above-described method. The thickness of the reflecting polyester film layer was 100 µm, the thickness of the silver-plated layer was 1.0 µm, and the protection layer was polyethylene film with the thickness of 20 µm.

The reflecting polyester film layer contained 10% nanometer modified inorganic filler, the filling particle was selected from titanium dioxide and barium sulfate (with a weight ratio of 1:1), the modified coating material thereof was silica, and the particle size of the nanometer modified inorganic filler was 200 nm. The temperature of the processing regions of the single-screw extruder was in the range of 250–300° C., the cell size and density were adjusted by controlling the proportion of the masterbatch and supercritical carbon dioxide, 0.02 cubic meters of liquid carbon dioxide was added to every kilogram of masterbatch, and the related properties of the obtained silver-plated reflecting film are listed in Table 3.

Embodiment 10

A silver-plated composite reflecting film of the present disclosure was manufactured according to the above-described method. The thickness of the reflecting polyester film layer was 80 µm, and the thickness of the silver-plated layer was 0.8 µm, and the protection layer was polypropylene film with the thickness of 15 µm.

The reflecting polyester film layer contained 20% nanometer modified inorganic filler, the filling particle was titanium dioxide, the modified coating material thereof was silica and aluminium oxide, and the particle size of the nanometer modified inorganic filler was 400 nanometers. The temperature of the processing regions of the single-screw extruder was in the range of 250–300° C., the cell size and density were adjusted by controlling the proportion of the masterbatch and supercritical carbon dioxide, 0.1 cubic meters of liquid carbon dioxide was added to every kilogram of masterbatch, and the related properties of the obtained silver-plated reflecting film are listed in Table 3.

Embodiment 11

A silver-plated composite reflecting film of the present disclosure was manufactured according to the above-described method. The thickness of the reflecting polyester film layer was 60 µm, the thickness of the silver-plated layer was 1.0 µm, and the protection layer was polyester film with the thickness of 10 µm.

The reflecting polyester film layer contained 15% nanometer modified inorganic filler, the filling particle was calcium carbonate, the modified coating material was aluminium oxide, and the particle size of the nanometer modified inorganic filler was 300 nanometers. The temperature of the processing regions of the single-screw extruder was in the range of 250–300° C., the cell size and density were adjusted by controlling the proportion of the masterbatch and supercritical carbon dioxide, 0.05 cubic meters of liquid carbon dioxide was added to every kilogram of masterbatch, and the related properties of the obtained silver-plated reflecting film are listed in Table 3.

Embodiment 12

A silver-plated composite reflecting film of the present disclosure was manufactured according to the above-described method. The thickness of the reflecting polyester film layer was 90 µm, the thickness of the silver-plated layer was 0.8 µm, and the protection layer was polycarbonate film with the thickness of 5 µm.

The reflecting polyester film layer contained 12% nanometer modified inorganic filler, the filling particle was zinc oxide, the modified coating material thereof was silica, and the particle size of the nanometer modified inorganic filler was 200-400 nanometers. The temperature of the processing regions of the single-screw extruder was 250-300° C., the cell size and density were adjusted by controlling the proportion of the masterbatch and supercritical carbon dioxide, 0.08 cubic meters of liquid carbon dioxide was added to every kilogram of masterbatch, and the related properties of the obtained silver-plated reflecting film are listed in Table 3.

TABLE 3

Property test table for the composite reflecting films obtained in embodiments 9-12 Embodiments

| Item | | Embodiment 9 | Embodiment 10 | Embodiment 11 | Embodiment 12 |
|---|---|---|---|---|---|
| Reflectivity (%) | 550 nm | 99.5 | 99.4 | 98.5 | 99.6 |

Comparative Embodiment 1

A comparative composite reflecting film was manufactured according to the above-mentioned method, the thickness of the reflecting polyester film layer was 120 µm, and the protection layer was polycarbonate film with the thickness of 15 µm. The difference was the comparative reflecting film did not have a silver-plated layer.

The comparative reflecting polyester film layer contained 20% nanometer modified inorganic filler, the filling particle was zinc oxide, and the modified coating material thereof was silica. The obtained composite reflecting film had a cell size of 1-10 microns, with the density of 108-1010/cm3. The related properties of the comparative reflecting film are listed in Table 4.

Comparative Embodiment 2

A comparative composite reflecting film was manufactured according to the above-described method. The thickness of the comparative reflecting polyester film layer was 150 µm, the thickness of the silver-plated layer was 1.0 µm, and the protection layer was polycarbonate film with the thickness of 20 µm.

The reflecting polyester film layer contained 20% nanometer modified inorganic filler, the filling particle was zinc oxide, and the modified coating material thereof was silica. The difference was the obtained comparative composite reflecting film did not adopt supercritical carbon dioxide for foaming, which did not have the micro-bubble structure of the present disclosure. The related properties of the obtained comparative reflecting film are listed in Table 4.

Comparative Embodiment 3

A comparative composite reflecting film was manufactured according to the above-mentioned method, the thickness of the reflecting polyester film layer was 100 μm, the thickness of the silver-plated layer was 1.0 μm, and the protection layer was polycarbonate film with the thickness of 10 μm. The difference was the comparative reflecting polyester film layer contained 30% nanometer modified inorganic filler, the filling particle was titanium dioxide, and the modified coating material thereof was silica. In this comparative Embodiment, the content of the nanometer modified inorganic filler was too high. The related properties of the obtained reflecting film are listed in Table 4.

TABLE 4

Reflectivity of the comparative composite reflecting films

| Item | | Embodiments | | |
| --- | --- | --- | --- | --- |
| | | Comparative Embodiment 1 | Comparative Embodiment 2 | Comparative Embodiment 3 |
| Reflectivity (%) | 550 nm | 96.3 | 98.2 | 98.9 |

As shown in the property test data in Table 1 to Table 4, the composite reflecting films provided by the present disclosure have a higher reflectivity as compared with the reflecting film provided by the comparative Embodiments.

The above described is just the preferable embodiments of the present disclosure and is not intended to limit the protection scope of the present disclosure. All equivalent alterations and modifications made according to the present disclosure will fall within the scope of the claims of the present disclosure.

We claim:

1. A method for manufacturing a silver-plated reflecting film, wherein the manufacturing method is consisting of following steps:
   manufacturing a reflecting polyester film layer;
   coating a silver-plated layer directly on one surface of the reflecting polyester film layer by a vacuum sputtering silver plating method; and
   applying a protection layer film on the silver-plated layer and obtaining the silver-plated reflecting film,
   wherein the vacuum sputtering silver plating method comprises:
   putting 99.99% silver in a target of a sputtering chamber, with Ar as a sputtering gas, a vacuum level of 10-1.0× $10^{-1}$ Pa, a working temperature of 850° C. to 1000° C., and a film forming speed of 0.01 mm/min to 5 mm/min; and
   forming the silver-plated layer on the reflecting polyester film layer;
   wherein the protection layer is a polycarbonate film, a polyethylene film, or a polypropylene film, the protection layer film is applied on the silver-plated layer by a dry-type film covering method,
   the dry-type film covering method comprises following steps:
   firstly the protection layer film passing through a heated channel of 90° C.; and
   then pressing the protection layer film onto the silver-plated layer.

2. The method for manufacturing the silver-plated reflecting film of claim 1, wherein after the forming the silver-plated layer on the reflecting polyester film layer, the method further comprising a step of performing an annealing treatment under nitrogen at the room temperature.

3. The method for manufacturing the silver-plated reflecting film of claim 1, further comprising rolling the silver-plated reflecting film up after the applying the protection layer film on the silver-plated layer.

4. The method for manufacturing the silver-plated reflecting film of claim 1, wherein the protection layer film is manufactured by a tape casting method, in which a polymer is melt-extruded by a single-screw extruder to form a film on a cold roller, thereby obtaining the protection layer film by drawing and rolling up.

5. The method for manufacturing the silver-plated reflecting film of claim 4, wherein the reflecting polyester film layer is prepared by a physical foaming process that comprises:
   melting and plastifying a master batch containing additives and supercritical carbon dioxide;
   shearing and mixing the same into a uniform solution in the single-screw extruder; and
   extruding the solution out of a calender through a die head to cool, take a shape, and be stretched bi-directionally to obtain the reflecting polyester film layer.

6. The method for manufacturing the silver-plated reflecting film of claim 5, wherein the reflecting polyester film layer is foamed during a stretching process after extrusion, and the temperature of processing regions of the single-screw extruder is within a range of 250° C. to 300° C.

7. The method for manufacturing the silver-plated reflecting film of claim 1, wherein the reflecting polyester film layer comprises 5%-25% nanometer modified inorganic filler, and the percentage is a percentage by weight.

8. The method for manufacturing the silver-plated reflecting film of claim 7, wherein the nanometer modified inorganic filler comprises filling particles and modified coating material, the filling particles are selected from one of, or a combination of at least two of, titanium dioxide, barium sulfate, calcium carbonate and zinc oxide, and the modified coating material is silica and/or alumina.

9. The method for manufacturing the silver-plated reflecting film of claim 7, wherein the particle size of the nanometer modified inorganic filler is in a range of 200 nm to 400 nm.

10. The method for manufacturing the silver-plated reflecting film of claim 1, wherein the reflecting polyester film layer has a micro-bubble structure prepared by physical foaming with supercritical carbon dioxide, and the micro-bubbles have a cell size of 1-10 microns and density of $10^8$-$10^{10}$/cm$^3$.

11. The method for manufacturing the silver-plated reflecting film of claim 1, wherein the thickness of the reflecting polyester film layer is in a range of 50 μm to 150 μm, the thickness of the silver-plated layer is in a range of 0.5 μm to 1.5 μm, and the thickness of the protection layer is in a range of 2 μm to 30 μm.

\* \* \* \* \*